(12) United States Patent
Ueyama

(10) Patent No.: US 11,821,917 B2
(45) Date of Patent: Nov. 21, 2023

(54) CONTACT PIN AND SOCKET

(71) Applicant: Enplas Corporation, Saitama (JP)

(72) Inventor: Yuki Ueyama, Saitama (JP)

(73) Assignee: Enplas Corporation, Saitama (JP)

( * ) Notice: Subject to any disclaimer, the term of this patent is extended or adjusted under 35 U.S.C. 154(b) by 240 days.

(21) Appl. No.: 17/299,011

(22) PCT Filed: Dec. 2, 2019

(86) PCT No.: PCT/JP2019/046932
§ 371 (c)(1),
(2) Date: Jun. 2, 2021

(87) PCT Pub. No.: WO2020/116362
PCT Pub. Date: Jun. 11, 2020

(65) Prior Publication Data
US 2022/0137093 A1    May 5, 2022

(30) Foreign Application Priority Data

Dec. 3, 2018  (JP) ................................. 2018-226559

(51) Int. Cl.
*G01R 1/067* (2006.01)
*G01R 1/04* (2006.01)

(52) U.S. Cl.
CPC ....... *G01R 1/06722* (2013.01); *G01R 1/0466* (2013.01); *G01R 1/06733* (2013.01)

(58) Field of Classification Search
CPC .............. G01R 1/06722; G01R 1/0466; G01R 1/06733
See application file for complete search history.

(56) References Cited

U.S. PATENT DOCUMENTS

| | | | | |
|---|---|---|---|---|
| 6,396,293 | B1 * | 5/2002 | Vinther | G01R 1/06722 |
| | | | | 324/755.05 |
| 7,815,438 | B2 * | 10/2010 | Kazama | H01R 13/2421 |
| | | | | 439/66 |
| 10,411,386 | B2 * | 9/2019 | Kazama | H01R 13/24 |

FOREIGN PATENT DOCUMENTS

| | | | | |
|---|---|---|---|---|
| JP | 2010-025844 | | 2/2010 | |
| JP | 2010-091436 | | 4/2010 | |
| JP | 2020051861 A | * | 4/2020 | ......... G01R 1/07314 |
| KR | 10-2011-0024267 | | 3/2011 | |
| KR | 10-2011-0024267 | | 9/2011 | |

\* cited by examiner

*Primary Examiner* — Paresh Patel

(57) ABSTRACT

A contact pin includes: a first plunger including a first contact portion provided at an upper end, and a hollow body portion provided below the first contact portion; a second plunger including: a second contact portion provided at a lower end; a first taper portion that is provided above the second contact portion and enlarges in diameter toward the second contact portion; a small diameter portion provided above the first taper portion; and a large diameter portion that is provided above the small diameter portion and is inserted into the body portion to abut on an inner wall surface of the body portion; and a spring for energizing the first and second contact portions to be separated from each other. The first taper portion is capable of abutting on a lower end of the body portion in a case where the first and second contact portions approach each other.

4 Claims, 8 Drawing Sheets

CONTACT PIN AND SOCKET

TECHNICAL FIELD

The present disclosure relates to a contact pin and a socket used in, for example, performance inspection of IC packages or the like.

BACKGROUND ART

Sockets have been used for inspecting electrical components such as IC packages as described in, for example, Patent Literature (hereinafter, referred to as "PTL") 1. Such sockets are each provided with a plurality of contact pins that electrically connect an electrical component and a board for inspection (hereinafter also referred to as "inspection board"), which is a board on the inspection device side.

Each of the contact pins includes, a first plunger that is hollow and comes into contact with a terminal of the electrical component, a second plunger that comes into contact with a terminal of the inspection board and is inserted into the first plunger, and a coil spring that is placed between the first plunger and the second plunger and energizes the first plunger and the second plunger to be separated from each other.

CITATION LIST

Patent Literature

PTL 1
Japanese Patent Application Laid-Open No. 2010-91436

SUMMARY OF INVENTION

Technical Problem

However, the contact pin described in PTL 1 involves the following problems because the second plunger has a straight shape.

(1) Reducing the diameter of the second plunger causes a situation where the upper end of the second plunger bites into (or is stuck on) the inner peripheral wall of the first plunger when the second plunger is tilted with respect to the first plunger, which leads an increase in sliding resistance.

(2) Enlarging the diameter of the second plunger causes a situation where the second plunger is less likely to be tilted with respect to the first plunger and comes into contact unstably with the first plunger, which leads unstable conductivity of the contact pin.

An object of the present disclosure is to provide a contact pin capable of improving the conductivity while suppressing the sliding resistance of a second plunger with respect to a first plunger, and to provide a socket using the contact pin.

Solution to Problem

A contact pin according to an aspect of the present disclosure includes: a first plunger including a first contact portion provided at an upper end of the first plunger, and a body portion being hollow and provided below the first contact portion; a second plunger including: a second contact portion provided at a lower end of the second plunger; a first taper portion that is provided above the second contact portion and enlarges in diameter toward the second contact portion; a small diameter portion provided above the first taper portion; and a large diameter portion that is provided above the small diameter portion and is inserted into the body portion to abut on an inner wall surface of the body portion; and a spring for energizing the first contact portion and the second contact portion to be separated from each other, wherein the first taper portion is capable of abutting on a lower end of the body portion in a case where the first contact portion and the second contact portion approach each other.

A socket according to an aspect of the present disclosure includes the contact pin, and a support including a through hole into which the contact pin is inserted.

Advantageous Effects of Invention

According to the present disclosure, it is possible to improve the conductivity while suppressing the sliding resistance of a second plunger with respect to a first plunger.

DESCRIPTION OF EMBODIMENTS

Hereinafter, an embodiment of the present disclosure will be described in detail with reference to the drawings. Note that, the embodiment described below is merely an example, and the present disclosure is not limited by this embodiment. Components of the embodiment described below can also be combined as needed. In some cases, some components may not be used.

In the following embodiment, for convenience, contact pins will be described assuming that a first plunger is placed on an upper side, and a second plunger placed on a lower side. However, it is needless to say that the arrangement of the contact pins and sockets is not limited to such an arrangement.

[Contact Pin]

Figure 1A:
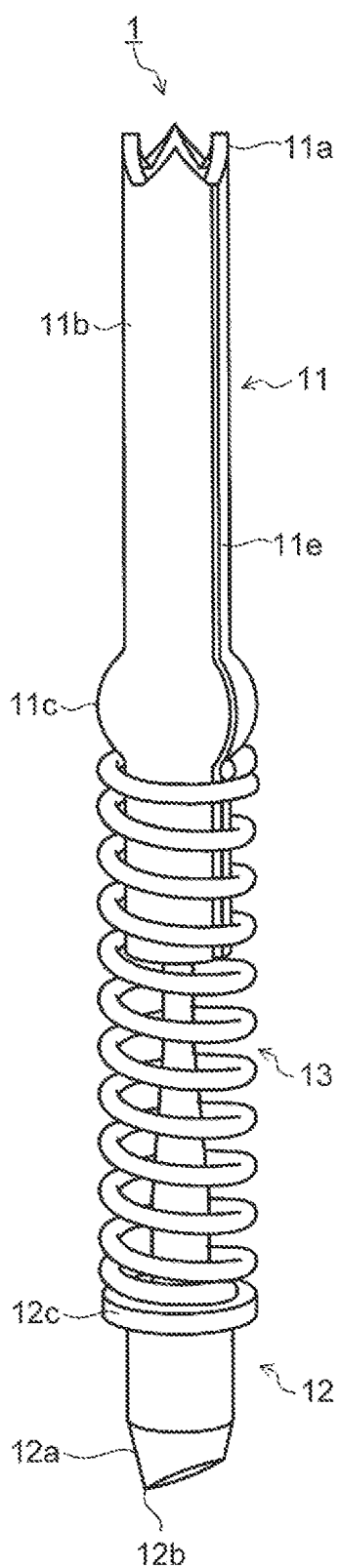
FIG. 1A is a perspective view of a contact pin according to an embodiment.
Figure 1B:
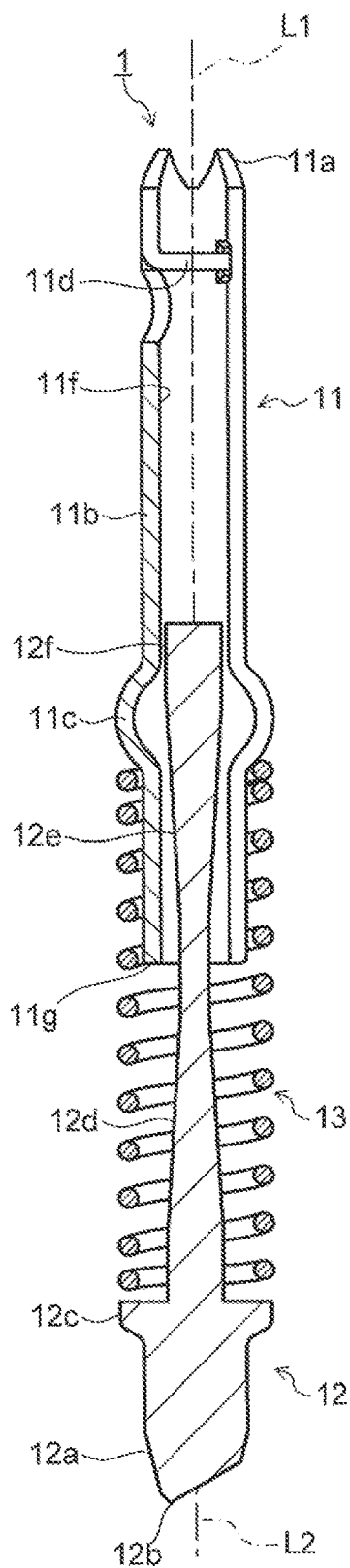
FIG. 1B is a partial cross-sectional view of the contact pin according to the embodiment.

With reference to FIGS. 1A and 1B, a description will be given of contact pin 1 according to the present embodiment. FIG. 1A is a perspective view of contact pin 1 according to the embodiment. FIG. 1B is a partial cross-sectional view of contact pin 1 according to the embodiment. Contact pin 1 includes first plunger 11, second plunger 12, and coil spring 13 (exemplary "spring").

First plunger 11 is a hollow member having a substantially cylindrical shape. Second plunger 12 is a solid member having a substantially columnar shape. Second plunger 12 is inserted into first plunger 11 from below and can move forward/backward with respect to first plunger 11 along axis L1 (or nearly along axis L1) of first plunger 11. First plunger 11 and second plunger 12 are each formed of a conductive material.

[First Plunger]

At an upper end of first plunger 11, contact portion 11a (exemplary "first contact portion") that comes into contact with a solder ball of an IC-package to be described later is provided. In the present embodiment, contact portion 11a is constituted of a plurality of cut sections with pointed tips. That is, contact portion 11a exhibits a crown-like shape.

Below contact portion 11a, body portion 11b which is hollow is provided. Body portion 11b is provided with bulging portion 11c (exemplary "first enlarged diameter portion") that has a curved surface shape and bulges radially outward (in a direction away from axis L1). In the present embodiment, bulging portion 11c exhibits a shape obtained by horizontally cutting upper and lower parts of a hollow sphere, respectively.

First plunger 11 also includes lid 11d at an upper part thereof, more specifically, between bulging portion 11c and contact portion 11a and slightly below contact portion 11a. Lid 11d prevents cutting debris, which is scraped from the solder ball due to contact by contact portion 11a, from entering downward.

In the manner described above, it is possible to prevent a relative movement between first plunger 11 and second plunger 12 from being interrupted due to the cutting debris having entered a gap between first plunger 11 and second plunger 12. Lid 11d is formed by making a substantially circular notch in a part of body portion 11b of first plunger 11, and then folding, radially inward (in a direction approaching axis L1), a cut section surrounded by the notch.

First plunger 11 is formed by rounding a plate material into a cylindrical shape so that a first end edge and a second end edge, respectively extending in a vertical direction (upward/downward direction), are abutted against each other. Reference sign 11e in FIGS. 1A and 1B denotes an abutting portion of the first end edge and the second end edge. Incidentally, FIG. 1B is a cross-sectional view of contact pin 1 taken along a vertical plane passing through abutting portion 11e. Further, bulging portion 11c is formed by pressing the plate material, and, in bulging portion 11c, both outer wall surface and inner wall surface 11f bulge radially outward.

[Second Plunger]

At a lower end of second plunger 12, contact portion 12a having a tapered shape to be in contact with a terminal of an inspection board to be described later (exemplary "second contact portion") is provided. Contact portion 12a exhibits such a shape that is obtained by obliquely cutting a downwardly tapered cone. Thus, tip 12b of contact portion 12a, i.e., a contact point with the terminal of the inspection board is placed away from axis L2 of second plunger 12.

Above contact portion 12a, flange portion 12c (exemplary "second enlarged diameter portion") that bulges radially outward (in a direction away from axis L2) is provided. Coil spring 13 is placed between bulging portion 11c of first plunger 11 and flange portion 12c of second plunger 12.

Above flange portion 12c, taper portion 12d (exemplary "first taper portion") is provided. Taper portion 12d gradually tapers in diameter upward from an upper end of a large-diameter columnar portion extending upward from an upper end of flange portion 12c. In other words, taper portion 12d enlarges in diameter toward contact portion 12a.

Above taper portion 12d, taper portion 12e (exemplary "second taper portion") is provided. Taper portion 12e gradually enlarges in diameter upward from an upper end of a small-diameter columnar portion extending upward from an upper end of taper portion 12d. In other words, taper portion 12e tapers in diameter toward contact portion 12a.

Above taper portion 12e, large diameter portion 12f having a columnar shape is provided. Large diameter portion 12f extends upward from an upper end of taper portion 12e. A diameter of large diameter portion 12f is equal to a diameter at a lower end of taper portion 12d. The diameter of large diameter portion 12f is also equal to a diameter at the upper end of taper portion 12e.

[Socket]

Figure 2:
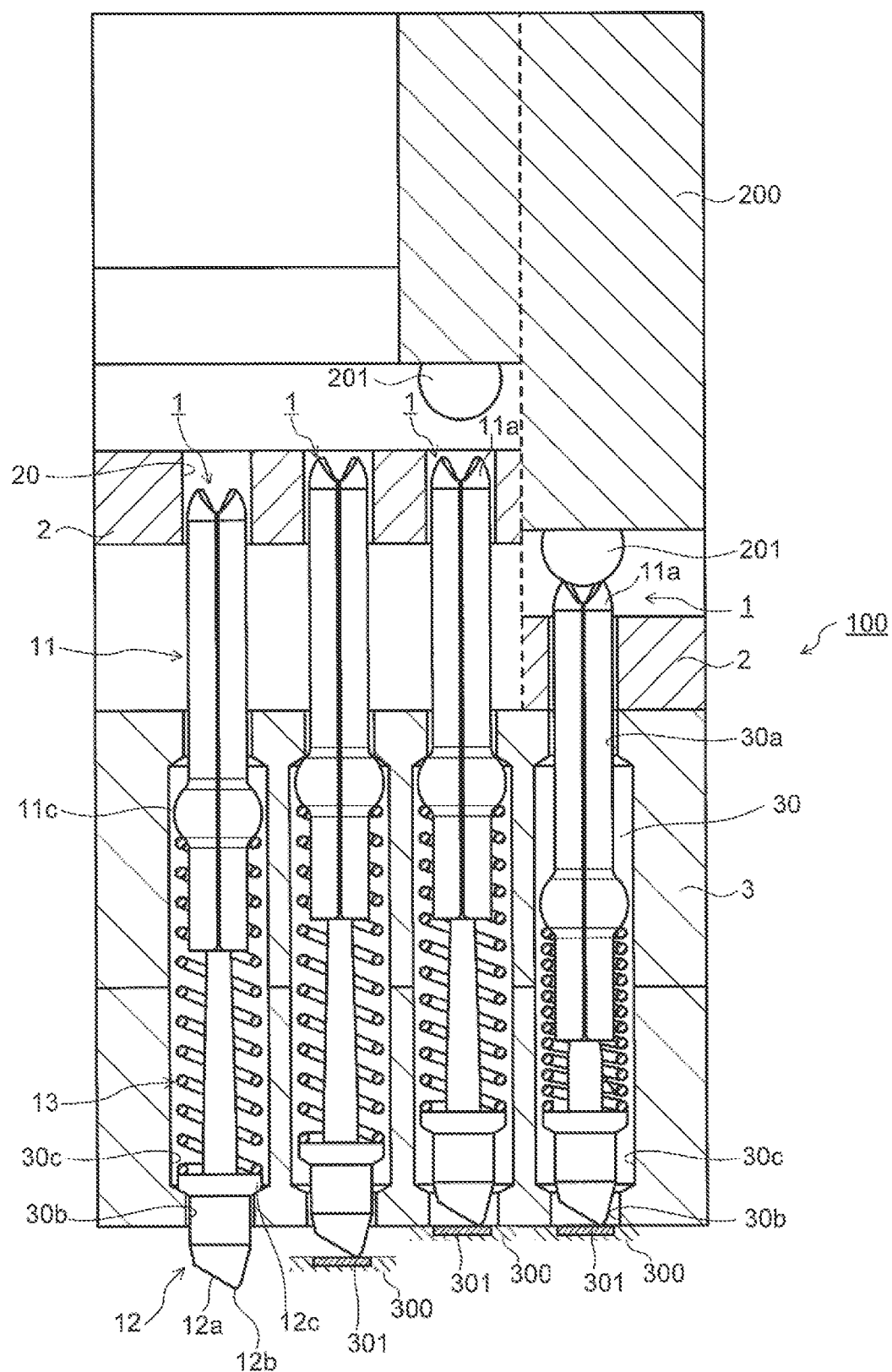
FIG. 2 illustrate the contact pins and a socket.

With reference to FIG. 2, socket 100 according to the present embodiment will be described. FIG. 2 is a cross-sectional view of contact pin 1 and socket 100 in the embodiment. In FIG. 2, for convenience, sockets 100 in different states are illustrated side by side. Socket 100 includes contact pin 1, floating plate 2, and housing 3.

On a lower surface of IC package 200 to be connected to socket 100, a plurality of solder balls 201 which is a terminal is arranged in a matrix form. A plurality of contact pins 1 is arranged in a matrix form so as to correspond to the arrangement of solder balls 201.

Floating plate 2 is provided with a plurality of through holes 20 penetrating floating plate 2 in the vertical direction (upward/downward direction). An arrangement of through holes 20 corresponds to the arrangement of solder balls 201 and the arrangement of contact pins 1. Moreover, a horizontal cross-section of each through hole 20 exhibits a circular shape.

Housing 3 (exemplary "support") is provided with a plurality of through holes 30 penetrating housing 3 in the vertical direction (upward/downward direction). An arrangement of through holes 30 corresponds to the arrangement of solder balls 201 and the arrangement of contact pins 1. Moreover, a horizontal cross-section of each through hole 30 exhibits a circular shape.

With such a configuration of floating plate 2 and housing 3, contact pins 1 are each inserted into vertically aligned through hole 20 and through hole 30 in accordance with the arrangement of solder balls 201.

Through hole 30 is constituted of small diameter portion 30a at the upper side, small diameter portion 30b at the lower side, and large diameter portion 30c formed between small diameter portion 30a and small diameter portion 30b.

An inner diameter of small diameter portion 30a is smaller than the largest outer diameter of bulging portion 11c of first plunger 11, the largest outer diameter of flange portion 12c of second plunger 12, and the largest outer diameter of coil spring 13. Further, the inner diameter of small diameter portion 30b is equal to an inner diameter of small diameter portion 30a.

An inner diameter of large diameter portion 30c is slightly larger than the largest outer diameter of bulging portion 11c of first plunger 11, the largest outer diameter of flange portion 12c of second plunger 12, and the largest outer diameter of coil spring 13.

The largest outer diameter of a part (including contact portion 11a) of first plunger 11 above bulging portion 11c is smaller than the inner diameter of small diameter portion 30a and an inner diameter of through hole 20 of floating plate 2. This allows the part of first plunger 11 above bulging portion 11c to penetrate small diameter portion 30a and through hole 20 of floating plate 2, and project upward over an upper surface of floating plate 2.

The largest outer diameter of contact portion 12a below flange portion 12c of second plunger 12 is smaller than the inner diameter of small diameter portion 30b. This allows contact portion 12a of second plunger 12 to penetrate small diameter portion 30b and project downward beyond the lower surface of housing 3.

Thus, while contact pin 1 is prevented from coming off from through hole 30 of housing 3, coil spring 13 can extend/contract within through hole 30, and second plunger 12 can move forward/backward from below first plunger 11.

(State of Socket)

In FIG. 2, for respective contact pins 1, sockets 100 in different states are illustrated. Hereinafter, the respective states will be described from the left in FIG. 2.

The first from the left indicates a natural state in which no external force is applied on contact pin 1, that is, a state in which coil spring 13 extends, and thus, contact pin 1 also extends. In this state, second plunger 12 is supported from below while flange portion 12c abuts on a step between small diameter portion 30b and large diameter portion 30c of through hole 30, and contact portion 12a projects from the lower surface of housing 3.

The second from the left indicates a state in which contact pin 1 is overall pushed up by inspection board 300. Specifically, contact portion 12a of second plunger 12 comes into contact with terminal 301 of inspection board 300, and contact pin 1 is pushed upward until an upper part of bulging portion 11c of first plunger 11 abuts on a step between small diameter portion 30a and large diameter portion 30c of through hole 30. In this state, coil spring 13 is slightly compressed.

The third from the left indicates a state in which contact pin 1 is further pushed up by inspection board 300. Specifically, an upper surface of inspection board 300 comes into contact with the lower surface of housing 3.

In this state, second plunger 12 is further inserted into first plunger 11 and coil spring 13 contracts. Moreover, in this state, IC package 200 is placed on floating plate 2, but solder ball 201 does not come into contact with contact portion 11a of contact pin 1. Note that, as illustrated in FIG. 2, while IC package 200 is being placed on floating plate 2, a gap in the vertical direction (upward/downward direction) is formed between solder ball 201 provided on the lower surface of IC package 200 and floating plate 2.

The fourth from the left indicates a state at the time of inspecting IC package 200. In this state, first plunger 11 is pushed downward by solder ball 201, and coil spring 13 further contracts.

At this time, between second plunger 12 and terminal 301 of inspection board 300, a repulsion force generated from coil spring 13 acts as a preload between second plunger 12 and terminal 301 of inspection board 300.

[Operational Effects]

Figure 3A:
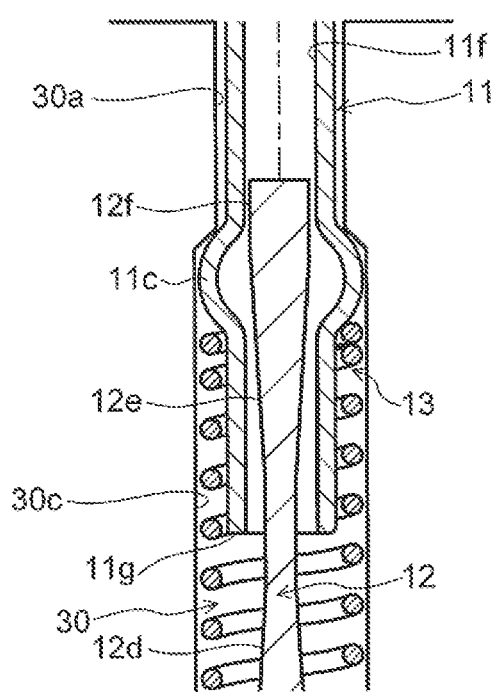
FIG. 3A is a schematic cross-sectional view to illustrate an operational effect of the embodiment.
Figure 3B:
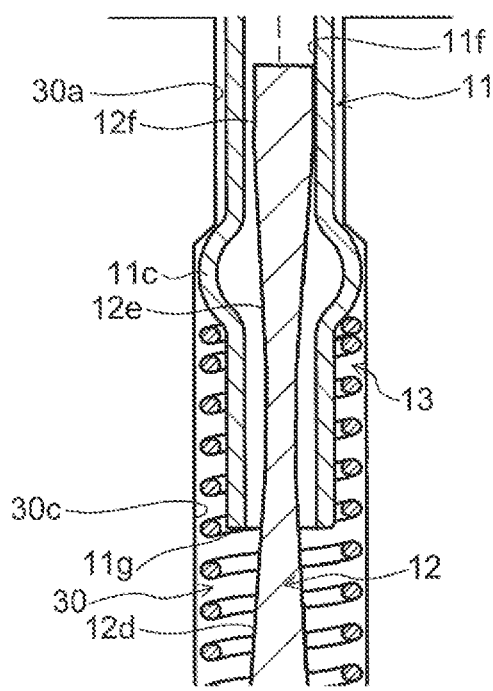
FIG. 3B is a schematic cross-sectional view to illustrate an operational effect of the embodiment.
Figure 3C:
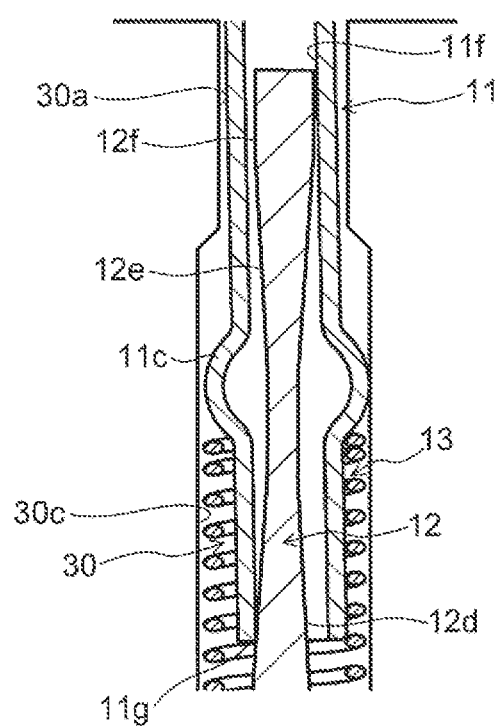
FIG. 3C is a schematic cross-sectional view to illustrate an operational effect of the embodiment.

With reference to FIGS. 3A to 3C, operational effects of the present embodiment will be described. FIGS. 3A to 3C are schematic cross-sectional views for describing the operational effects of the embodiment. FIG. 3A indicates the leftmost state in FIG. 2. FIG. 3B indicates the third state from the left in FIG. 2. FIG. 3C indicates the fourth state from the left in FIG. 2.

As described above, a gap is formed between an inner circumferential surface of large diameter portion 30c of through hole 30 and coil spring 13. Thus, from the state illustrated in FIG. 3A to the state illustrated in FIG. 3B, coil spring 13 contracts while meandering within the gap.

Coil spring 13 contracts while meandering within the gap formed with the inner circumferential surface of large diameter portion 30c of through hole 30, and thus, second plunger 12 is tilted with respect to first plunger 11 and comes into contact with inner wall surface 11f of first plunger 11 (see. FIG. 3B).

In the present embodiment, second plunger 12 includes large diameter portion 12f that comes into contact with inner wall surface 11f of first plunger 11, and is provided with, below large diameter portion 12f, taper portion 12e which tapers in diameter downward.

Thus, it is possible to abut large diameter portion 12f of second plunger 12 on inner wall surface 11f of first plunger 11 while second plunger 12 is slightly tilted with respect to first plunger 11. This can prevent second plunger 12 from biting into (or from being stuck on) inner wall surface 11f of first plunger 11.

Consequently, large diameter portion 12f of second plunger 12 can be stably brought into contact with respect to inner wall surface 11f of first plunger 11. As a result, it is possible to stabilize an electric resistance value between first plunger 11 and second plunger 12 and thus improve the conductivity of contact pin 1.

When IC package 200 is pushed down further from the state illustrated in FIG. 3B, contact portion 11a of first plunger 11 and contact portion 12a of second plunger 12 approach each other while large diameter portion 12f of second plunger 12 remains abutting on inner wall surface 11f of first plunger 11.

Since second plunger 12 has taper portion 12d, a gap between taper portion 12d and lower edge 11g of first plunger 11 is smaller toward a lower part of taper portion 12d. Thus, approaching of contact portion 11a of first plunger 11 and contact portion 12a of second plunger 12 to each other allows taper portion 12d of second plunger 12 to abut on lower edge 11g of first plunger 11 without tilting second plunger 12 much with respect to first plunger 11.

When taper portion 12d of second plunger 12 abuts on lower edge 11g of first plunger 11, first plunger 11 and second plunger 12 are in two-point contact state. As a result, second plunger 12 can be more stably brought into contact with respect to first plunger 11.

Further, since second plunger 12 is provided with taper portion 12d, even when an insertion length of second plunger 12 with respect to first plunger 11 is changed, the state is maintained in which first plunger 11 and second plunger 12 are in two-point contact state. This improves contacting stability when moving second plunger 12 with respect to first plunger 11. Moreover, the conductivity of contact pin 1 can be improved by causing first plunger 11 and second plunger 12 to be in contact with each other at two points.

Further, since second plunger 12 has taper portion 12d, a load in a lateral direction can be generated at an abutting part between taper portion 12d and lower edge 11g of first plunger 11. As a result, contact pressure of second plunger 12 with respect to first plunger 11 can be stabilized, and thus, the conductivity of contact pin 1 can be improved.

Further, since second plunger 12 tapers in diameter from large diameter portion 12f, stress can be relieved, which is applied to a lower part than large diameter portion 12f due to large diameter portion 12f of second plunger 12 pressing inner wall surface 11f of first plunger 11.

Further, in the present embodiment, bulging portion 11c of first plunger 11 has a curved shape, and the diameter of which gradually enlarges upward from an upper end of coil spring 13. This improves fitting performance between coil spring 13 and bulging portion 11c.

Further, since bulging portion 11c has a curved shape, a contact area thereof with the inner wall surface of large diameter portion 30c can be reduced. Accordingly, first plunger 11 is likely to be tilted with respect to the vertical direction, following meandering of coil spring 13, and thus, first plunger 11 is easily tilted with respect to second plunger 12.

Consequently, contact pressure of large diameter portion 12f of second plunger 12 to inner wall surface 11f of first plunger 11 can be further increased. As a result, it is possible to more stabilize the electric resistance value between first plunger 11 and second plunger 12 and thus further improve the conductivity of contact pin 1.

Further, with the improved followability of first plunger 11 with respect to the meandering of coil spring 13, and the reduced contact area between bulging portion 11c and the inner wall surface of large diameter portion 30c, first plunger 11 moves more smoothly within through hole 30. Thus, movability of contact pin 1 can be improved.

Furthermore, in the present embodiment, as illustrated in FIG. 1B, tip 12b of contact portion 12a of second plunger 12 is placed away from axis L2. Thus, second plunger 12 is, when being pushed upward by inspection board 300, easily tilted with respect to the vertical direction.

Further, when second plunger 12 is tilted with respect to the vertical direction, first plunger 11 is tilted in the direction opposite to second plunger 12 because the lower part thereof is pressed by second plunger 12. Thus, the contact pressure of large diameter portion 12f of second plunger 12 with respect to inner wall surface 11f of first plunger 11 can be further increased. As a result, it is possible to more stabilize the electric resistance value between first plunger 11 and second plunger 12 and thus further improve the conductivity of contact pin 1.

[First Modification]

Figure 4:
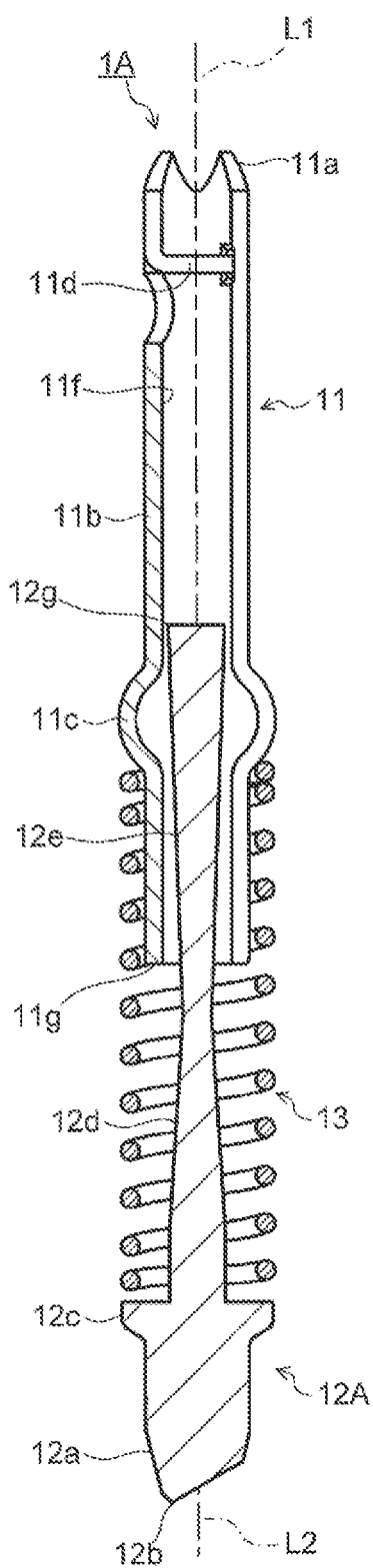
FIG. 4 is a partial cross-sectional view of a contact pin according to a first modification.

With reference to FIG. 4, a first modification of the contact pin will be described. The first modification has a configuration common to the above-described embodiment. A description of the common configuration will be omitted. FIG. 4 is a partial cross-sectional view of contact pin 1A according to the first modification.

At a lower end of second plunger 12A, contact portion 12a is provided. Above contact portion 12a, flange portion 12c is provided. Above flange portion 12c, taper portion 12d is provided. Above taper portion 12d, taper portion 12e is provided.

In the first modification, an upper end edge of taper portion 12e constitutes large diameter portion 12g. A diameter of large diameter portion 12g is equal to a diameter at a lower end of taper portion 12d.

According to the first modification, since large diameter portion 12g is constituted of the upper end edge of taper portion 12e, as compared with that having a columnar large diameter portion 12f, second plunger 12A is more easily tilted with respect to first plunger 11.

[Second Modification]

Figure 5:
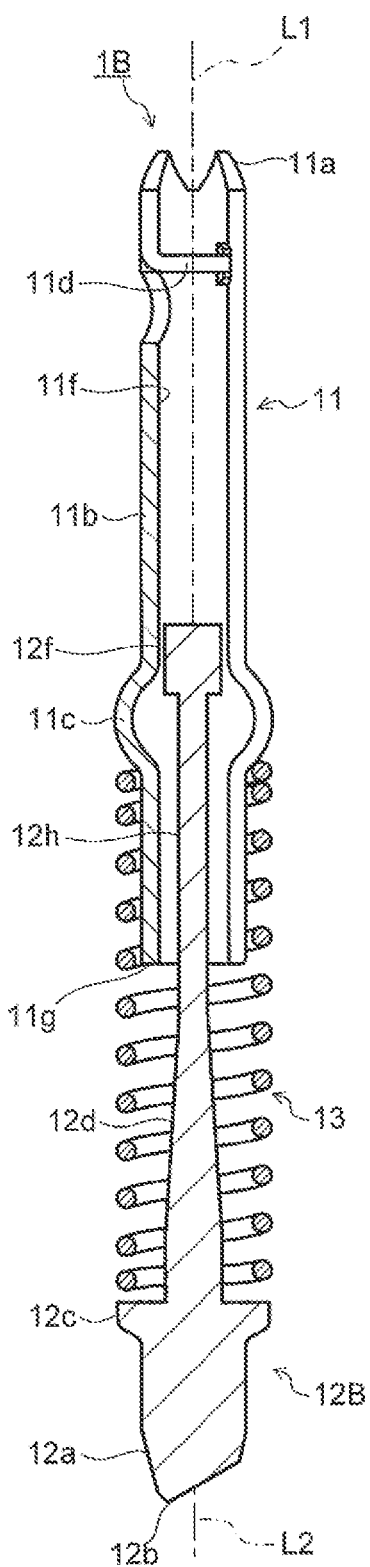
FIG. 5 is a partial cross-sectional view of a contact pin according to a second modification.

With reference to FIG. 5, a second modification of the contact pin will be described. The second modification has a configuration common to the above-described embodiment. A description of the common configuration will be omitted. FIG. 5 is a partial cross-sectional view of contact pin 1B according to the second modification.

At a lower end of second plunger 12B, contact portion 12a is provided. Above contact portion 12a, flange portion 12c is provided. Above flange portion 12c, taper portion 12d is provided. Above taper portion 12d, columnar small diameter portion 12h is provided, and, above small diameter portion 12h, large diameter portion 12f is provided.

According to the second modification, since large diameter portion 12f and taper portion 12d are connected by columnar small diameter portion 12h, as compared with connecting large diameter portion 12f and taper portion 12d by taper portion 12e, a resistance value can be reduced.

[Other Modifications]

In the above-described embodiment, the first plunger is assumed to be produced by rounding the plate material; however, a production method of the first plunger is not limited to this. For example, the first plunger may be produced by machining a bar. In this case, even in a bulging portion, an inner peripheral wall may be formed into a straight shape.

Further, in the above-described embodiment, the bulging portion is formed into the shape obtained by horizontally cutting the upper and lower parts of the sphere; however, the shape of the bulging portion is not limited to this. For example, the bulging portion may have a shape obtained by cutting upper and lower parts of a vertically or horizontally long ellipsoid.

In addition, in the above-described embodiment, the contact pins and sockets are applied to the inspection of the IC packages; however, the contact pins and sockets of the present disclosure are not limited to this and can be applied to various applications of other electrical components.

Further, in the above-described embodiment, the coil spring is assumed to be placed between the bulging portion of the first plunger and the flange portion of the second plunger; however, the arrangement of the coil spring is not limited to this. For example, the coil spring may be placed inside the body portion of the first plunger to press the upper end of the second plunger. In addition, the coil spring is not limited to a compression spring and may be a tension spring.

This application claims priority based on Japanese Patent Application No. 2018-226559, filed on Dec. 3, 2018, the entire contents of which including the specification and the drawings are incorporated herein by reference.

INDUSTRIAL APPLICABILITY

The present disclosure can be widely utilized for a contact pin and a socket for electrically connecting electrical components and a wiring board.

REFERENCE SIGNS LIST 1, 1A, 1B Contact pin
2 Floating plate
3 Housing
11 First plunger
11a Contact portion
11b Body portion
11c Bulging portion
11d Lid
11e Abutting portion
11f Inner wall surface
11g Lower end
12, 12A, 12B Second plunger
12a Contact portion
12b Tip
12c Flange portion
12d Taper portion
12e Taper portion
12f Large diameter portion
12g Large diameter portion
12h Small diameter portion
13 Coil spring
20 Through hole
30 Through hole
30a Small diameter portion
30b Small diameter portion
30c Large diameter portion 100 Socket
200 IC package
201 Solder ball

The invention claimed is:

1. A contact pin, comprising:
a first plunger including a first contact portion provided at an upper end of the first plunger, and a body portion being hollow and provided below the first contact portion;
a second plunger including: a second contact portion provided at a lower end of the second plunger; a first taper portion that is provided above the second contact portion and enlarges in diameter toward the second contact portion; a small diameter portion provided above the first taper portion; and a large diameter portion that is provided above the small diameter portion and is inserted into the body portion to abut on an inner wall surface of the body portion, a diameter of the large diameter portion being equal to a diameter at a lower end of the first taper portion; and
a spring for energizing the first contact portion and the second contact portion to be separated from each other, wherein
the first taper portion is capable of abutting on a lower end of the body portion in a case where the first contact portion and the second contact portion approach each other.

2. The contact pin according to claim 1, wherein
the second plunger includes a second taper portion that enlarges in diameter upward from an upper end of the small diameter portion, and the large diameter portion extends upward from an upper end of the second taper portion is constituted of an upper end edge of the second taper portion.

3. The contact pin according to claim 1, wherein
the first plunger includes a first enlarged diameter portion provided on the body portion and having a curved surface-shape, the first enlarged diameter portion bulging radially outward,
the second plunger includes a second enlarged diameter portion that is provided between the second contact portion and the first taper portion and that bulges radially outward, and
the spring is placed between the first enlarged diameter portion and the second enlarged diameter portion.

4. A socket, comprising:
the contact pin according to claim 1; and
a support including a through hole into which the contact pin is inserted.

* * * * *